(12) United States Patent
Chu

(10) Patent No.: US 9,743,512 B2
(45) Date of Patent: Aug. 22, 2017

(54) FLEXIBLE DISPLAY DEVICE

(71) Applicant: Boe Technology Group Co., Ltd., Beijing (CN)

(72) Inventor: Shangchieh Chu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 151 days.

(21) Appl. No.: 14/778,698

(22) PCT Filed: Mar. 16, 2015

(86) PCT No.: PCT/CN2015/074272
§ 371 (c)(1),
(2) Date: Sep. 21, 2015

(87) PCT Pub. No.: WO2016/065795
PCT Pub. Date: May 6, 2016

(65) Prior Publication Data
US 2016/0330828 A1     Nov. 10, 2016

(30) Foreign Application Priority Data

Oct. 31, 2014    (CN) .......................... 2014 1 0602821

(51) Int. Cl.
*G06F 1/16*     (2006.01)
*H05K 5/00*     (2006.01)
(Continued)

(52) U.S. Cl.
CPC ........... *H05K 1/028* (2013.01); *G02F 1/1339* (2013.01); *G06F 1/1652* (2013.01); *G09F 9/301* (2013.01);
(Continued)

(58) Field of Classification Search
CPC .... G06F 1/1601; G06F 1/1613; G06F 1/1626; G06F 1/163; G06F 1/1633; G06F 1/1637; G06F 1/1641; G06F 1/1652
(Continued)

(56) References Cited

U.S. PATENT DOCUMENTS 9,058,758 B2 *   6/2015   Shin ..................... G09G 3/3688
9,119,298 B2 *   8/2015   Park ..................... H05K 5/0226
(Continued)

FOREIGN PATENT DOCUMENTS

CN     101133434     2/2005
CN     103971603     8/2014
(Continued)

OTHER PUBLICATIONS

Office action from Chinese Application No. 201410602821.2 dated May 3, 2016.
(Continued)

*Primary Examiner* — Anthony Haughton
(74) *Attorney, Agent, or Firm* — Calfee, Halter & Griswold LLP

(57) ABSTRACT

The present invention provides a flexible display device. A plurality of limiting structures are arranged at the back side of a display screen in rows with an end surface of a bottom end of each limiting structure fixed on the back side of the display screen. The head end has a protrusion, the protrusion comprising a first abutting surface and a second abutting surface adjoined with each other, an opening of an angle between the two surfaces away from the display screen. The tail end has a groove, the groove comprising a third abutting surface and a fourth abutting surface adjoined with each other, an opening of an angle between the two surfaces away
(Continued)

from the display screen and the angle being larger than the angle between the first abutting surface and the second abutting surface.

20 Claims, 4 Drawing Sheets

(51) Int. Cl.
  *H05K 7/00* (2006.01)
  *H05K 1/02* (2006.01)
  *G02F 1/1339* (2006.01)
  *G09F 9/30* (2006.01)
  *H04M 1/02* (2006.01)

(52) U.S. Cl.
  CPC ........ *H04M 1/0268* (2013.01); *H05K 5/0017* (2013.01); *H01L 2251/5338* (2013.01); *H05K 2201/10128* (2013.01)

(58) Field of Classification Search
  USPC .............. 361/679.21–679.3, 679.55, 679.56; 349/56–60; 345/905
  See application file for complete search history.

(56) References Cited

U.S. PATENT DOCUMENTS

| | | | |
|---|---|---|---|
| 9,123,290 B1* | 9/2015 | Cho | G06F 1/1652 |
| 9,301,389 B2* | 3/2016 | Yeo | H05K 1/0281 |
| 9,307,658 B2* | 4/2016 | Song | H05K 5/0217 |
| 9,510,440 B2* | 11/2016 | Nam | H05K 1/028 |
| 9,608,231 B2* | 3/2017 | Lee | H01L 51/5237 |
| 2008/0018631 A1* | 1/2008 | Hioki | G02F 1/133305 345/206 |
| 2011/0043976 A1* | 2/2011 | Visser | G09F 9/00 361/679.01 |
| 2012/0081849 A1 | 4/2012 | Hsiao et al. | |
| 2012/0283878 A1* | 11/2012 | Roberts | H05B 37/0263 700/275 |
| 2013/0114193 A1* | 5/2013 | Joo | F16M 11/08 361/679.01 |
| 2014/0198465 A1* | 7/2014 | Park | H05K 5/0226 361/749 |
| 2015/0035812 A1* | 2/2015 | Shin | G09G 3/3688 345/204 |

FOREIGN PATENT DOCUMENTS

| | | |
|---|---|---|
| CN | 203825958 | 9/2014 |
| CN | 104318869 | 1/2015 |
| WO | 2006/090434 | 8/2009 |
| WO | 2014/010329 | 1/2014 |

OTHER PUBLICATIONS

International Search Report and Written Opinion from PCT/CN2015/074272 dated Jul. 29, 2015.

* cited by examiner

FLEXIBLE DISPLAY DEVICE

RELATED APPLICATIONS

This application is the U.S. national phase entry of PCT/CN2015/074272, filed Mar. 15, 2015, which claims priority to Chinese Application No. 201410602821.2, filed on Oct. 31, 2014, the entire disclosures of which are incorporated by reference.

FIELD OF THE INVENTION

The present invention relates to the field of display technology, particularly to a flexible display device.

BACKGROUND OF THE INVENTION

The flexible display device is fabricated using a flexible substrate, hence, it has flexibility. The flexible display device has advantages of being flexible, having optimal flexibility and high durability, being lighter and thinner, having low power consumption etc., so that it is widely applied in various fields such as intelligent wearable electronic devices and portable mobile electronic devices, which has become a research hotspot in the art at present.

The flexible display device can bend towards the display side or the back side (a side opposite to the display side); however, if the bending exceeds a certain degree, the display device may be easily damaged due to over-bending. As shown in FIGS. 1a, 1b and 1c, a plurality of limiting structures 11 are arranged in the edge area A2 (the edge area A2 is located around the display area A1) of the back side of the display screen 12 in the prior art, the limiting structure 11 is a ladder shaped structure. When the display screen 12 bends towards the back side, the sides of the adjacent limiting structures 11 abut against each other, such that the display screen 12 cannot bend further after it bends for a certain angle, thereby eliminating the problem that the display screen 12 may be damaged due to over-bending.

However, the above limiting structure can only prevent the display device from over bending towards the back side and it cannot limit the bending degree of the display device bending towards the display side. If it is required to limit the degree of the display device bending toward the display side, limiting structures need to be arranged in the frame area of the display side. This may further increase the thickness of the display device undoubtedly, and the frame width of the display device cannot be narrowed.

SUMMARY OF THE INVENTION

In order to overcome the above defect in the prior art, the technical problem to be solved by the present invention is: to provide a flexible display device, so as to limit the bending degree of the display device in two directions of bending towards the display side and the back side without increasing the thickness of the display device further and not limiting the frame width of the display device.

In order to achieve the above object, the present invention adopts the following technical solutions:

The present invention provides a flexible display device comprising: a display screen, with one side of the display screen for image display being a display side, and a side opposite to the display side being a back side.

A plurality of limiting structures are arranged at the back side of the display screen, each limiting structure comprising a bottom end, a head end and a tail end. An end surface of the bottom end is fixed on the back side of the display screen. The head end has a protrusion, the protrusion comprising a first abutting surface and a second abutting surface adjoined with each other. An opening of an angle between the first abutting surface and the second abutting surface faces away from the display screen; the tail end has a groove, the groove comprising a third abutting surface and a fourth abutting surface adjoined with each other. An opening of an angle between the third abutting surface and the fourth abutting surface faces away from the display screen, and the angle between the third abutting surface and the fourth abutting surface is larger than the angle between the first abutting surface and the second abutting surface. The plurality of limiting structures are arranged in at least one row, and a protrusion of a latter limiting structure in one row is located in a groove of a previous limiting structure, and the first abutting surface of the latter limiting structure is opposite to the third abutting surface of the previous limiting structure, and the second abutting surface of the latter limiting structure is opposite to the fourth abutting surface of the previous limiting structure. When the flexible display device bends towards the back side to a first curvature, the first abutting surface of the latter limiting structure and the third abutting surface of the previous limiting structure abut against each other so as to prevent the flexible display device from bending further. When the flexible display device bends towards the display side to a second curvature, the second abutting surface of the latter limiting structure and the fourth abutting surface of the previous limiting structure abut against each other so as to prevent the flexible display device from bending further.

In some embodiments, the angle between the first abutting surface and the second abutting surface is 15 degrees to 75 degrees.

In some embodiments, the angle between the third abutting surface and the fourth abutting surface is 90 degrees to 150 degrees.

In some embodiments, the plurality of limiting structures are arranged in four rows, which are parallel to the four sides of the display screen respectively.

In some embodiments, the plurality of limiting structures are located at edge areas of the back side of the display screen.

In some embodiments, the first curvature is smaller than or equal to a maximum curvature that can be achieved by the flexible display device bending towards the back side on the premise of being not damaged.

In some embodiments, the second curvature is smaller than or equal to a maximum curvature that can be achieved by the flexible display device bending towards the display side on the premise of being not damaged.

In some embodiments, a position where the first abutting surface and the second abutting surface in the protrusion of the latter limiting structure are adjoined with each other is connected with a position where the third abutting surface and the fourth abutting surface in the groove of the previous limiting structure are adjoined with each other through a pivot, so that the protrusion of the latter limiting structure rotates anticlockwise around the pivot in the groove of the previous limiting structure when the flexible display device bends towards the back side, and the protrusion of the latter limiting structure rotates clockwise around the pivot in the groove of the previous limiting structure when the flexible display device bends towards the display side.

In some embodiments, the end surfaces of the bottom ends of the plurality of limiting structure are bonded to the back side of the display screen. In some embodiments, the flexible display device further comprises: a guide rail located at the back side of the display screen and arranged along a frame of the display screen, the bottom ends of the plurality of limiting structures are movably connected to the guide rail, so as to enable the plurality of limiting structures to move along the guide rail. In the flexible display device provided by the present invention, since the limiting structure are only arranged at the back side of the display device, the thickness of the display device will not be increased, and the frame width of the display device will not be limited either. The head end of the limiting structure has a protrusion, the tail end has a groove, the angle between the first abutting surface and the second abutting surface that constitute the protrusion is less than the angle between the third abutting surface and the fourth abutting surface that constitute the groove. In a row of limiting structures, the protrusion of the latter limiting structure is located in the groove of the previous limiting structure, and the first abutting surface of the latter limiting structure is opposite to the third abutting surface of the previous limiting structure, the second abutting surface of the latter limiting structure is opposite to the fourth abutting surface of the previous limiting structure. When the display device bends towards the back side, the first abutting surface of the latter limiting structure and the third abutting surface of the previous limiting structure abut against each other, which prevents the display device from over bending towards the back side; when the flexible display device bends towards the display side, the second abutting surface of the latter limiting structure and the fourth abutting surface of the previous limiting structure abut against each other, which prevents the display device from over bending towards the display side. Consequently, the object of limiting the bending degree of the display device in two directions of bending towards the display side and the back side on the premise of not increasing the thickness of the display device further and not limiting the frame width of the display device is achieved, which effectively avoids damage of the display device due to overbending.

BRIEF DESCRIPTION OF THE DRAWINGS

In order to explain the embodiments of the present invention or the technical solutions in the prior art more clearly, the drawings to be used in the embodiments or the description of the prior art will be introduced briefly next. As is apparent from the description, the drawings described below are only some embodiments of the present invention. An ordinary skilled person in the art, having the benefit of these drawings, may conceive of additional embodiments without undue experimentation that are embodied in these drawings.

DETAILED DESCRIPTION OF THE INVENTION

In order to make the above objects, the technical solutions in the embodiments of the present invention will be described clearly and completely with reference to the drawings. The embodiments described are only a part rather than all of the embodiments of the present invention. Based on the embodiments in the present invention, all other embodiments obtained by the ordinary skilled person in the art without undue experimentation belong to the protection scope of the present invention.

Figure 1A:
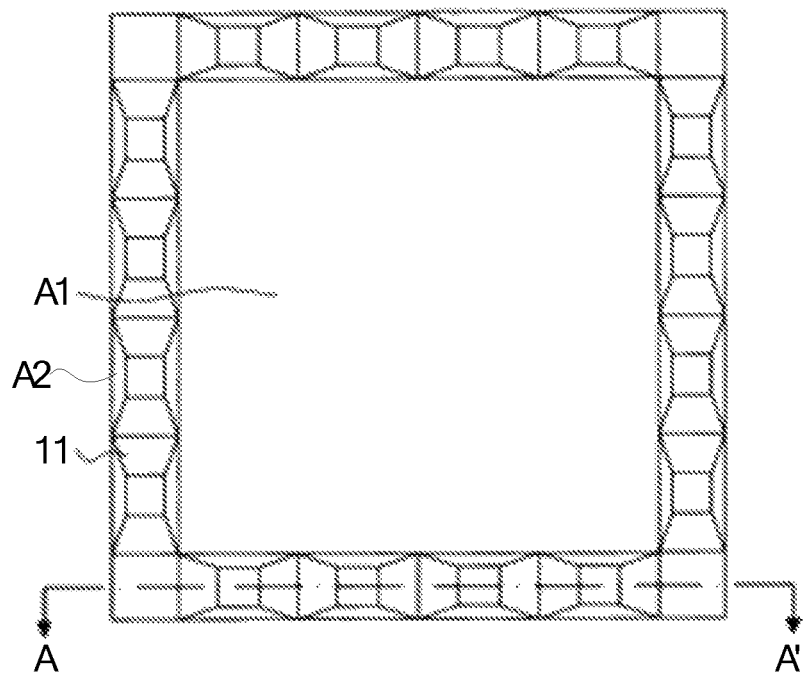
FIG. 1a is a plan view of a flexible display device in the prior art.
Figure 1B:
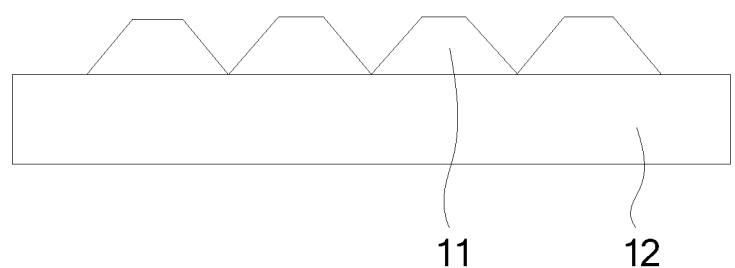
FIG. 1b is a sectional view of the display device as shown in FIG. 1a in AA' direction.
Figure 1C:
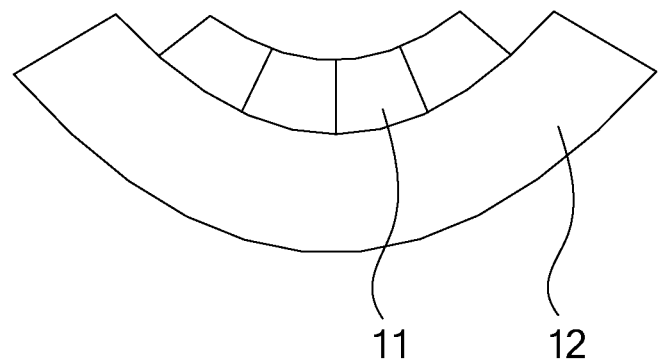
FIG. 1c is a sectional view of the flexible display device in the prior art when bending towards the back side.
Figure 2A:
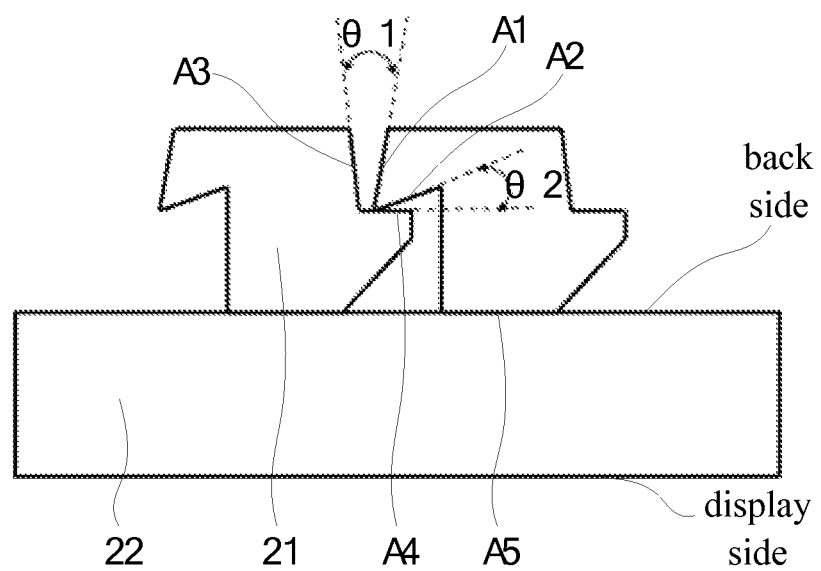
FIG. 2a is a sectional view of a flexible display device provided by the embodiment of the present invention.
Figure 2B:
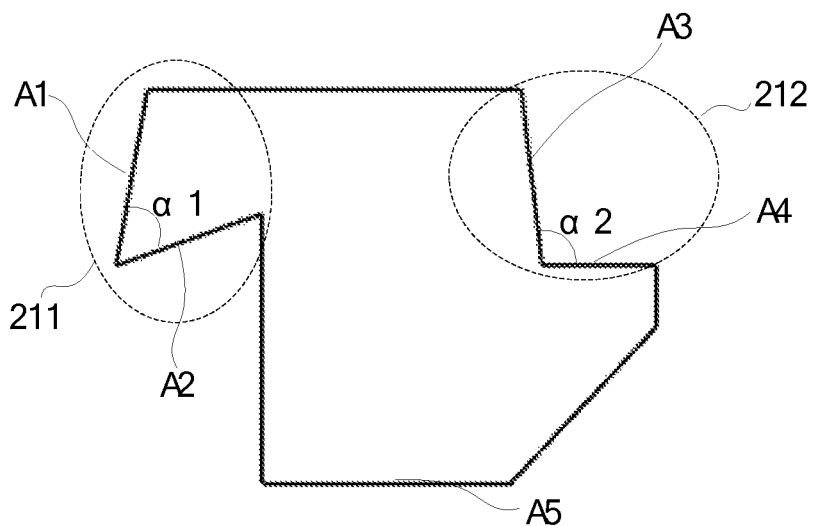
FIG. 2b is a sectional view of a limiting structure of the flexible display device provided by the embodiment of the present invention.

The embodiment of the present invention provides a flexible display device, as shown in FIGS. 2a and 2b, comprising: a display screen 22, a side of the display screen 22 for image display is a display side, a side opposite to the display side is a back side; and a plurality of limiting structures 21 arranged at the back side of the display screen.

The limiting structure 21 comprises a bottom end, a head end and a tail end. An end surface A5 of the bottom end is fixed on the back side of the display screen 22; the head end has a protrusion 211, the protrusion 211 comprising a first abutting surface A1 and a second abutting surface A2 adjoined with each other. An opening of an angle $\alpha 1$ between the first abutting surface and the second abutting surface faces away from the display screen 22; the tail end has a groove 212, the groove 212 comprising a third abutting surface A3 and a fourth abutting surface A4 adjoined with each other, an opening of an angle $\alpha 2$ between the third abutting surface A3 and the fourth abutting surface A4 faces away from the display screen 22, and the angle $\alpha 2$ between the third abutting surface A3 and the fourth abutting surface A4 is larger than the angle $\alpha 1$ between the first abutting surface A1 and the second abutting surface A2.

The plurality of limiting structures are arranged in at least one row. A protrusion 211 of a latter limiting structure in one row is located in a groove 212 of a previous limiting structure, and the first abutting surface A1 of the latter limiting structure is opposite to the third abutting surface A3 of the previous limiting structure. The second abutting surface A2 of the latter limiting structure is opposite to the fourth abutting surface A4 of the previous limiting structure.

When the flexible display device bends towards the back side to a first curvature, the first abutting surface A1 of the latter limiting structure and the third abutting surface A3 of the previous limiting structure abut against each other, so as to prevent the flexible display device from bending further.

When the flexible display device bends towards the display side to a second curvature, the second abutting surface A2 of the latter limiting structure and the fourth abutting surface A4 of the previous limiting structure abut against each other, so as to prevent the flexible display device from bending further.

Specifically, referring to FIG. 2a, when the flexible display device does not bend, the display side and the back side of the display screen 22 are both planes, the respective limiting structures 21 are on the same plane. Here, since $\alpha 2 > \alpha 1$, an angle $\theta 1$ is formed between the first abutting surface A1 of the latter limiting structure and the third abutting surface A3 of the previous limiting structure. The angle $\theta 1$ is a radian that the display device can bend towards the back side, i.e., the value of the first curvature is determined. An angle $\theta 2$ is formed between the second abutting surface A2 of the latter limiting structure and the fourth abutting surface A4 of the previous limiting structure, the angle θ2 is a radian that the display device can bend towards the display side, i.e., the value of the second curvature is determined.

Figure 2C:
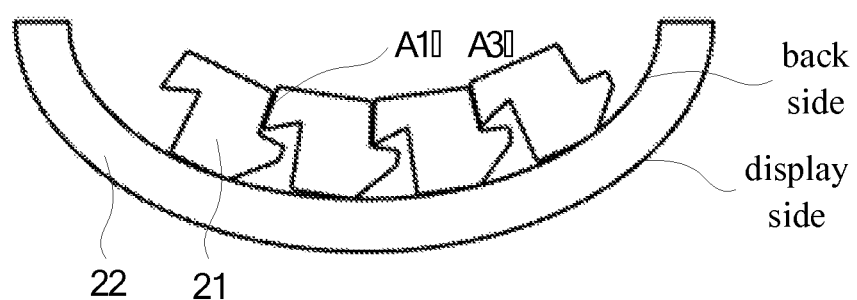
FIG. 2c is a sectional view of the flexible display device provided by the embodiment of the present invention when bending towards the back side.

When the display device bends towards the back side, as shown in FIG. 2c, the first abutting surface A1 of the latter limiting structure and the third abutting surface A3 of the previous limiting structure rotate oppositely, when the two rotate over the angle θ1 together, they will joint completely and generate a mutual abutting effect, the display device can no longer bend towards the back side further, thereby limiting the curvature of the display device bending towards the back side within the first curvature.

Figure 2D:
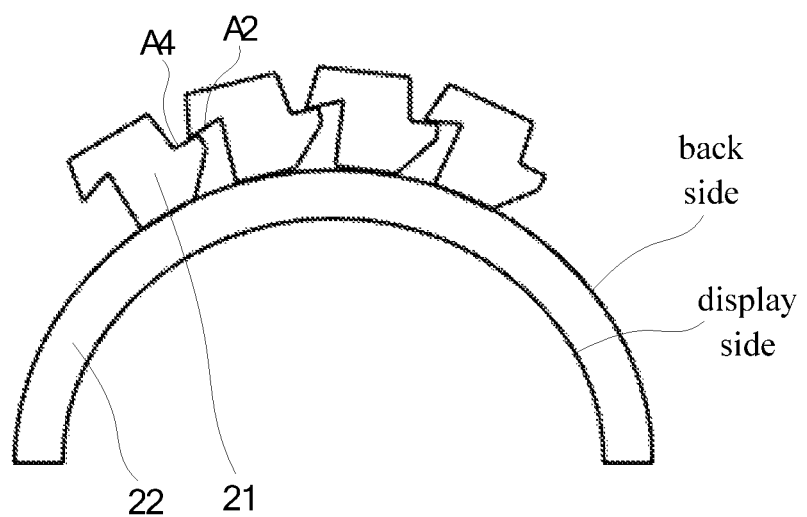
FIG. 2d is a sectional view of the flexible display device provided by the embodiment of the present invention when bending towards the display side.

When the display device bends towards the display side, as shown in FIG. 2d, the first abutting surface A2 of the latter limiting structure and the third abutting surface A4 of the previous limiting structure rotate oppositely. When the two rotate over the angle θ2 together, they will joint completely and generate a mutual abutting effect, the display device can no longer bend towards the display side further, thereby limiting the curvature of the display device bending towards the display side within the second curvature.

The figures show that the flexible display device provided by this embodiment limits the bending degree of the display device in the two directions of the display side and the back side, and avoids the damage to the display device due to over-bending effectively. Since the above object can be achieved by only arranging limiting structure for limiting the bending degree on the back side of the display device, it is unnecessary to arrange limiting structures for limiting the bending degree towards the display side on the display side of the display device. Hence, it will not result in further increase of the thickness of the display device and limitation to the frame width of the display device, which is benefit for thinness and narrow frame of the display device.

It should be noted that the first curvature in this embodiment may be smaller than or equal to a maximum curvature that can be achieved by the flexible display device bending towards the back side on the premise of being not damaged, the second curvature may be smaller than or equal to a maximum curvature that can be achieved by the flexible display device bending towards the display side on the premise of being not damaged, thereby ensuring effectively that the flexible display device will not be damaged due to over-bending.

In this embodiment, the degree (i.e., the first curvature) that the flexible display device can bend towards the back side actually and the degree (i.e., the second curvature) that it can bend towards the display side actually depend on the angle θ1 between the first abutting surface A1 of the latter limiting structure and the third abutting surface A3 of the previous limiting structure and the angle θ2 between the second abutting surface A2 of the latter limiting structure and the fourth abutting surface A4 of the previous limiting structure when the flexible display device does not bend respectively. The angles θ1 and θ2 in turn depend on the angle α1 between the first abutting surface A1 and the second abutting surface A2 of the protrusion 211 of the limiting structure 21, the angle α2 between the third abutting surface A3 and the fourth abutting surface A4 of the groove 212, as well as the respective inclination degrees and inclination directions of the first abutting surface A1, the second abutting surface A2, the third abutting surface A3, and the fourth abutting surface A4 relative to the end surface A5 of the bottom end of the limiting structure 21. Therefore, the flexible display device with the desired bending degree can be obtained by setting the angles α1, α2 as well as the inclination degrees and inclination directions of the respective abutting surfaces. More specifically, in some embodiments, the angle α1 between the first abutting surface A1 and the second abutting surface A2 may be 15 degrees to 75 degrees, and the angle α2 between the third abutting surface A3 and the fourth abutting surface A4 may be between 90 degrees to 150 degrees.

In order to enable the flexible display device to bend in directions parallel to the four sides of the display screen 22, preferably, the plurality of limiting structures 21 can be arranged in four rows, the arranged four rows of limiting structures are parallel to the four sides of the display screen 22 respectively. In some embodiments, the limiting structures 21 can be arranged in the edge area of the back side of the display screen 22, the limiting structures 21 are not arranged in the display area of the display screen, it is ensured that the limiting structures 21 will not influence the display quality.

In this embodiment, two adjacent limiting structures 21 can be mutually independent and are not connected with each other, which achieves limitation to the bending degree of the display device only by placing the protrusion 211 of the latter limiting structure in the groove 212 of the previous limiting structure.

In other embodiments, the head end and the tail end of two adjacent limiting structures 21 can also be connected to prevent occurrence of the case that the protrusion 211 of the latter limiting structure slides out from the groove 212 of the previous limiting structure and cannot be recovered if the bending degree of the display device is too large. Specifically, a position (i.e., the tip of the protrusion 211) where the first abutting surface A1 and the second abutting surface A2 in the protrusion 211 of the latter limiting structure are adjoined with each other is connected with a position (i.e., the tip of the groove 212) where the third abutting surface A3 and the fourth abutting surface A4 in the groove 212 of the previous limiting structure are adjoined with each other through a pivot, so that the protrusion 211 of the latter limiting structure rotates anticlockwise around the pivot in the groove 212 of the previous limiting structure when the flexible display device bends towards the back side, and the protrusion 211 of the latter limiting structure rotates clockwise around the pivot in the groove 212 of the previous limiting structure when the flexible display device bends towards the display side. It not only ensures that the limiting structure achieves limiting function to the bending degree, but also prevents occurrence of the case that the protrusion 211 slides out from the groove 212 and cannot be recovered if the bending degree of the display device is too large, and improves the reliability of the flexible display device.

In addition, in the flexible display device provided by this embodiment, the end surfaces A5 of the bottom ends of the plurality limiting structure can be bonded to the back side of the display screen 22, thereby realizing fixed connection of the limiting structures 21 and the display screen 22. In other embodiments, movable connection between the limiting structure 21 and the display screen 22 can also be achieved by arranging a microstructure at the back side of the display screen 22.

Specifically, a guide rail can be arranged at the back side of the display screen 22 along the frame of the display screen 22, the bottom ends of the plurality of limiting structures are movably connected to the guide rail, so as to enable the plurality of limiting structures 21 to move along the guide rail. Consequently, when the flexible display device bends, the stress generated by mutual pressing between the respective limiting structures 21 can be reduced by the movement of the limiting structures 21 on the guide rail, which is benefit for improving the reliability of the flexible display device.

It should be noted that the display screen in this embodiment can be a liquid crystal panel, electronic paper or an organic light emitting diode (OLED) panel, for use in a display device having flexibility such as a mobile phone, a panel computer, a television, a display, a laptop, a digital photo frame, a navigator, etc.

This disclosure includes are only some embodiments of the present invention. However, the protection scope of the present invention is not limited to this, any modifications or replacements that can be easily conceived by the skilled person familiar with the present technical field within the technical scope disclosed by the present invention shall be covered within the protection scope of the present invention. Therefore, the protection scope of the present invention should depend on the protection scopes of the claims attached.

What is claimed is:

1. A flexible display device comprising:
a display screen, wherein a side of the display screen for image display is a display side, and wherein a side opposite to the display side is a back side;
a plurality of limiting structures arranged at the back side of the display screen, wherein each limiting structure comprises a bottom end, a head end and a tail end; wherein an end surface of the bottom end of each limiting structure is fixed on the back side of the display screen; wherein the head end of each limiting structure has a protrusion, the protrusion comprising a first abutting surface and a second abutting surface adjoined with each other, an opening of an angle between the first abutting surface and the second abutting surface faces away from the display screen; wherein the tail end of each limiting structure has a groove, the groove comprising a third abutting surface and a fourth abutting surface adjoined with each other, an opening of an angle between the third abutting surface and the fourth abutting surface faces away from the display screen, and the angle between the third abutting surface and the fourth abutting surface is larger than the angle between the first abutting surface and the second abutting surface;
wherein the plurality of limiting structures are arranged in at least one row, a protrusion of a latter limiting structure in one row is located in a groove of a previous limiting structure, and the first abutting surface of the latter limiting structure is opposite to the third abutting surface of the previous limiting structure, and the second abutting surface of the latter limiting structure is opposite to the fourth abutting surface of the previous limiting structure;
wherein when the flexible display device bends towards the back side to a first curvature, the first abutting surface of the latter limiting structure and the third abutting surface of the previous limiting structure abut against each other; and wherein when the flexible display device bends towards the display side to a second curvature, the second abutting surface of the latter limiting structure and the fourth abutting surface of the previous limiting structure abut against each other.

2. The flexible display device according to claim 1, wherein the angle between the first abutting surface and the second abutting surface is 15 degrees to 75 degrees.

3. The flexible display device according to claim 1, wherein the angle between the third abutting surface and the fourth abutting surface is 90 degrees to 150 degrees.

4. The flexible display device according to claim 1, wherein the plurality of limiting structures are arranged in four rows, which are parallel to the four sides of the display screen respectively.

5. The flexible display device according to claim 4, wherein the plurality of limiting structures are located at edge areas of the back side of the display screen.

6. The flexible display device according to claim 1, wherein the first curvature is smaller than or equal to a maximum curvature that can be achieved by the flexible display device bending towards the back side on the premise of being not damaged.

7. The flexible display device according to claim 1, wherein the second curvature is smaller than or equal to a maximum curvature that can be achieved by the flexible display device bending towards the display side on the premise of being not damaged.

8. The flexible display device according to claim 1, wherein a position where the first abutting surface and the second abutting surface in the protrusion of the latter limiting structure are adjoined with each other is connected with a position where the third abutting surface and the fourth abutting surface in the groove of the previous limiting structure are adjoined with each other through a pivot, so that the protrusion of the latter limiting structure rotates anticlockwise around the pivot in the groove of the previous limiting structure when the flexible display device bends towards the back side, and the protrusion of the latter limiting structure rotates clockwise around the pivot in the groove of the previous limiting structure when the flexible display device bends towards the display side.

9. The flexible display device according to claim 1, wherein the end surfaces of the bottom ends of the plurality of limiting structure are bonded to the back side of the display screen.

10. The flexible display device according to claim 9, wherein the angle between the first abutting surface and the second abutting surface is 15 degrees to 75 degrees.

11. The flexible display device according to claim 9, wherein the angle between the third abutting surface and the fourth abutting surface is 90 degrees to 150 degrees.

12. The flexible display device according to claim 9, wherein the plurality of limiting structures are arranged in four rows, which are parallel to the four sides of the display screen respectively.

13. The flexible display device according to claim 9, wherein the first curvature is smaller than or equal to a maximum curvature that can be achieved by the flexible display device bending towards the back side on the premise of being not damaged; and the second curvature is smaller than or equal to a maximum curvature that can be achieved by the flexible display device bending towards the display side on the premise of being not damaged.

14. The flexible display device according to claim 9, wherein a position where the first abutting surface and the second abutting surface in the protrusion of the latter limiting structure are adjoined with each other is connected with a position where the third abutting surface and the fourth abutting surface in the groove of the previous limiting structure are adjoined with each other through a pivot, so that the protrusion of the latter limiting structure rotates anticlockwise around the pivot in the groove of the previous limiting structure when the flexible display device bends towards the back side, and the protrusion of the latter limiting structure rotates clockwise around the pivot in the groove of the previous limiting structure when the flexible display device bends towards the display side.

15. The flexible display device according to claim 1, wherein the flexible display device further comprises: a guide rail located at the back side of the display screen and arranged along a frame of the display screen, the bottom ends of the plurality of limiting structures are movably connected to the guide rail, so as to enable the plurality of limiting structures to move along the guide rail.

16. The flexible display device according to claim 15, wherein the angle between the first abutting surface and the second abutting surface is 15 degrees to 75 degrees.

17. The flexible display device according to claim 15, wherein the angle between the third abutting surface and the fourth abutting surface is 90 degrees to 150 degrees.

18. The flexible display device according to claim 15, wherein the plurality of limiting structures are arranged in four rows, which are parallel to the four sides of the display screen respectively.

19. The flexible display device according to claim 15, wherein the first curvature is smaller than or equal to a maximum curvature that can be achieved by the flexible display device bending towards the back side on the premise of being not damaged; and the second curvature is smaller than or equal to a maximum curvature that can be achieved by the flexible display device bending towards the display side on the premise of being not damaged.

20. The flexible display device according to claim 15, wherein a position where the first abutting surface and the second abutting surface in the protrusion of the latter limiting structure are adjoined with each other is connected with a position where the third abutting surface and the fourth abutting surface in the groove of the previous limiting structure are adjoined with each other through a pivot, so that the protrusion of the latter limiting structure rotates anticlockwise around the pivot in the groove of the previous limiting structure when the flexible display device bends towards the back side, and the protrusion of the latter limiting structure rotates clockwise around the pivot in the groove of the previous limiting structure when the flexible display device bends towards the display side.

* * * * *